(12) United States Patent
Syu et al.

(10) Patent No.: US 8,457,586 B2
(45) Date of Patent: Jun. 4, 2013

(54) RADIO FREQUENCY CIRCUIT AND MIXER

(75) Inventors: Jin-Siang Syu, Taipei (TW);
Chin-Chun Meng, Taipei (TW)

(73) Assignee: Richwave Technology Corp., Taipei (TW)

( * ) Notice: Subject to any disclaimer, the term of this patent is extended or adjusted under 35 U.S.C. 154(b) by 16 days.

(21) Appl. No.: 13/364,543

(22) Filed: Feb. 2, 2012

(65) Prior Publication Data

US 2013/0049842 A1    Feb. 28, 2013

(30) Foreign Application Priority Data

Aug. 25, 2011    (TW) .............................. 100130448 A

(51) Int. Cl.
*H04B 1/26* (2006.01)
*H04K 3/00* (2006.01)
(52) U.S. Cl.
USPC .......................................... 455/326; 327/113

(58) Field of Classification Search
USPC ........................... 455/323, 326; 327/113–119
See application file for complete search history.

(56) References Cited

U.S. PATENT DOCUMENTS

| | | | |
|---|---|---|---|
| 2002/0163375 A1* | 11/2002 | Wu et al. | 327/356 |
| 2003/0130006 A1* | 7/2003 | Reynolds | 455/550 |
| 2005/0164669 A1* | 7/2005 | Molnar et al. | 455/320 |
| 2008/0139149 A1* | 6/2008 | Mu et al. | 455/200.1 |

* cited by examiner

*Primary Examiner* — Lee Nguyen
(74) *Attorney, Agent, or Firm* — McClure, Qualey & Rodack, LLP

(57) ABSTRACT

A radio frequency circuit includes a transformer, a local oscillator, a first mixer, a second mixer, a first variable gain amplifier, and a second variable gain amplifier. The first mixer includes a first inductor that is coupled between a positive in-phase input and a negative in-phase input. The second mixer includes a second inductor that is coupled between a positive quadrature input and a negative quadrature input. The first and second inductors provide inductive loads and improve conversion gains of the first and second mixers respectively.

22 Claims, 9 Drawing Sheets

RADIO FREQUENCY CIRCUIT AND MIXER

CROSS REFERENCE TO RELATED APPLICATIONS

This Application claims priority of Taiwan Patent Application No. 100130448, filed on Aug. 25, 2011, the entirety of which is incorporated by reference herein.

BACKGROUND OF THE INVENTION

1. Field of the Invention

The disclosure generally relates to an RF (Radio Frequency) circuit, and more particularly, relates to an RF circuit comprising a mixer coupled to an inductor.

2. Description of the Related Art

Generally speaking, in an RF circuit, a receiver comprises an LNA (Low Noise Amplifier) and a mixer. The mixer is an important component for converting an RF signal into a mid-band (middle frequency band) signal. The performance of the mixer is measured by a conversion gain, linearity, and a noise figure.

In the receiver, the LNA is configured to filter out noise in the RF signal. Therefore, the performance of the receiver results from the performance of the LNA. If a mixer with a high conversion gain and a low noise figure is adopted, the noise in the receiver will be reduced, and the cost of the LNA will be reduced, too.

BRIEF SUMMARY OF THE INVENTION

In one exemplary embodiment, the disclosure is directed to an RF (Radio Frequency) circuit, comprising: a transformer, receiving an RF signal so as to generate a pair of transformed signals; a local oscillator, generating a 1st oscillating signal, a 2nd oscillating signal, a 3rd oscillating signal, and a 4th oscillating signal according to a local oscillating signal; a 1st mixer, generating a 1st mixed signal according to the pair of transformed signals and the 1st and 2nd oscillating signals, comprising: a positive in-phase input, receiving the 1st oscillating signal; a negative in-phase input, receiving the 2nd oscillating signal; and a 1st inductor, coupled between the positive in-phase input and the negative in-phase input; a 2nd mixer, generating a 2nd mixed signal according to the pair of transformed signals and the 3rd and 4th oscillating signals, comprising: a positive quadrature input, receiving the 3rd oscillating signal; a negative quadrature input, receiving the 4th oscillating signal; and a 2nd inductor, coupled between the positive quadrature input and the negative quadrature input; a 1st VGA (Variable Gain Amplifier), generating a mid-band in-phase differential signal; and a 2nd VGA, generating a mid-band quadrature differential signal.

In another exemplary embodiment, the disclosure is directed to a mixer for generating a mixed signal according to a pair of transformed signals and 1st and 2nd oscillating signals, comprising: a positive in-phase input, receiving the 1st oscillating signal; a negative in-phase input, receiving the 2nd oscillating signal; and an inductor, coupled between the positive in-phase input and the negative in-phase input.

In one exemplary embodiment, the disclosure is directed to a mixer for generating a mixed signal according to a pair of transformed signals and 1st and 2nd oscillating signals, comprising: a positive in-phase input, receiving the 1st oscillating signal; a negative in-phase input, receiving the 2nd oscillating signal; a 1st inductor, coupled between the positive in-phase input and a 1st power node; and a 2nd inductor, coupled between the negative in-phase input and the 1st power node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
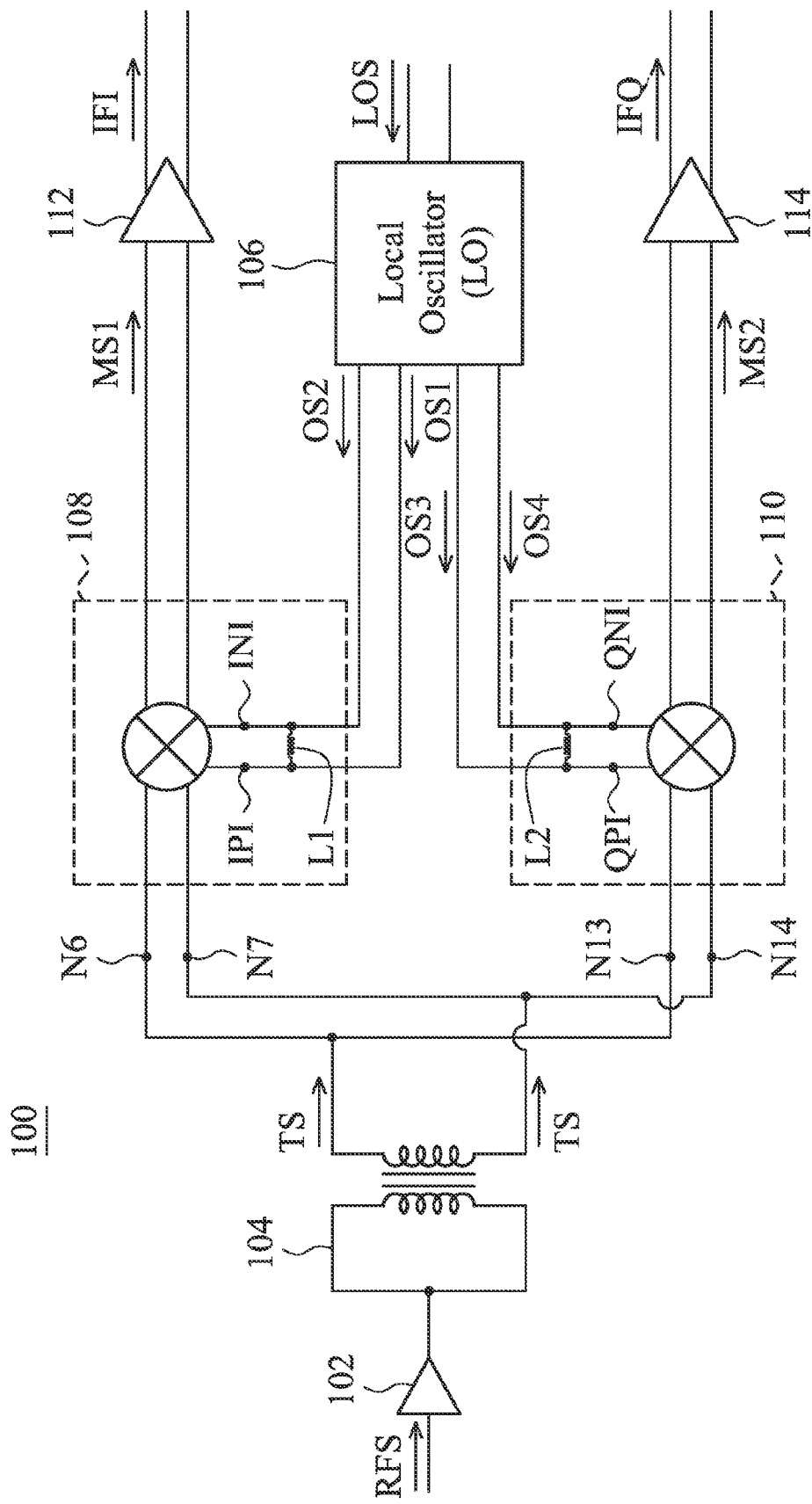
FIG. 1 is a diagram for illustrating an RF (Radio Frequency) circuit according to an embodiment of the invention.

FIG. 1 is a diagram for illustrating an RF (Radio Frequency) circuit 100 according to an embodiment of the invention. As shown in FIG. 1, the RF circuit 100 comprises an LNA (Low Noise Amplifier) 102, a transformer 104, a local oscillator 106, mixers 108, 110, and VGAs (Variable Gain Amplifiers) 112, 114. The LNA 102 is configured to receive an RF signal RFS, which has a central frequency equal to 2.4 GHz, and to amplify the RF signal RFS. The transformer 104 is electrically connected to the LNA 102, and configured to receive the amplified RF signal RFS so as to generate a pair of transformed signals TS. The local oscillator 106 is configured to receive a local oscillating signal LOS so as to generate oscillating signals OS1, OS2, OS3, and OS4. The mixer 108 is electrically connected to the transformer 104, and comprises a positive in-phase input IPI, a negative in-phase input INI, and an inductor L1. The mixer 108 is electrically connected to the local oscillator 106 through the positive in-phase input IPI and the negative in-phase input INT, wherein the positive in-phase input IPI is configured to receive the oscillating signal OS1, and the negative in-phase input INI is configured to receive the oscillating signal OS2. The inductor L1 is electrically coupled between the positive in-phase input IPI and the negative in-phase input INT. The mixer 108 is configured to generate a mixed signal MS1 according to the pair of transformed signals TS and the oscillating signals OS1, OS2. Similarly, the mixer 110 is electrically connected to the transformer 104, and comprises a positive quadrature input QPI, a negative quadrature input QNI, and an inductor L2. The mixer 110 is electrically connected to the local oscillator 106 through the positive quadrature input QPI and the negative quadrature input QNI, wherein the positive quadrature input QPI is configured to receive the oscillating signal OS3, and the negative quadrature input QNI is configured to receive the oscillating signal OS4. The inductor L2 is electrically coupled between the positive quadrature input QPI and the negative quadrature input QNI. The mixer 110 is configured to generate a mixed signal MS2 according to the pair of transformed signals TS and the oscillating signals OS3, OS4.

The VGA 112 is electrically connected to the mixer 108, and configured to generate a mid-band in-phase differential signal IFI according to the mixed signal MS1. Similarly, the VGA 114 is electrically connected to the mixer 110, and configured to generate a mid-band quadrature differential signal IFQ according to the mixed signal MS2. The invention provides the inductors L1, L2 increasing inductance of the load. This helps to improve conversion gains of the mixers 108, 110 and decrease local oscillating signal loss. The inductors L1, L2 can improve the performance of the RF circuit 100 effectively.

Figure 2:
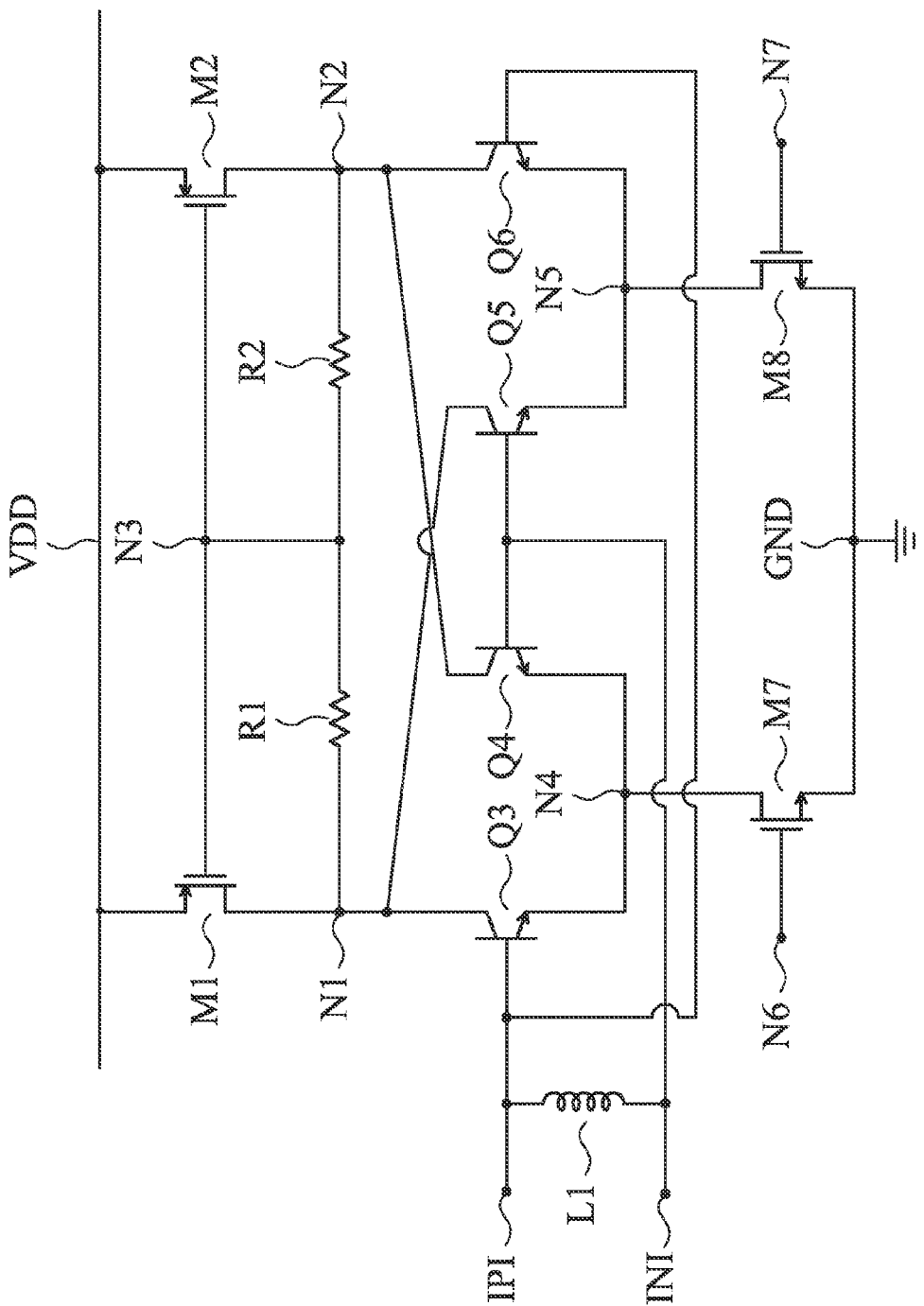
FIG. 2 is a diagram for illustrating a mixer according to an embodiment of the invention.

FIG. 2 is a diagram for illustrating the mixer 108 according to an embodiment of the invention. As shown in FIG. 2, the mixer 108 further comprises transistors M1, M2, Q3, Q4, Q5, Q6, M7 and M8. Each of the transistors M1, M2 may be a PMOS transistor (P-channel Metal-Oxide-Semiconductor Field-Effect Transistor), each of the transistors Q3, Q4, Q5 and Q6 may be an NPN-type BJT (NPN-type bipolar junction transistor), and each of the transistors M7, M8 may be a NMOS transistor (N-channel Metal-Oxide-Semiconductor Field-Effect Transistor). The transistor M1 is electrically coupled between a power node VDD and a node N1, and has a gate coupled to a node N3. The transistor M2 is electrically coupled between the power node VDD and a node N2, and has a gate coupled to the node N3. The transistor Q3 is electrically coupled between the node N1 and a node N4, and has a base coupled to the positive in-phase input IPI. The transistor Q4 is electrically coupled between the node N2 and the node N4, and has a base coupled to the negative in-phase input INI. The transistor Q5 is electrically coupled between the node N1 and a node N5, and has a base coupled to the negative in-phase input INI. The transistor Q6 is electrically coupled between the node N2 and the node N5, and has a base coupled to the positive in-phase input IPI. The transistor M7 is electrically coupled between the node N4 and a power node GND, and has a gate coupled to the transformer 104 through a node N6. The transistor M8 is electrically coupled between the node N5 and the power node GND, and has a gate coupled to the transformer 104 through a node N7. A resistor R1 is electrically coupled between the nodes N1, N3, and a resistor R2 is electrically coupled between the nodes N2, N3. The nodes N1, N2 are both electrically coupled to the VGA 112.

Figure 3:
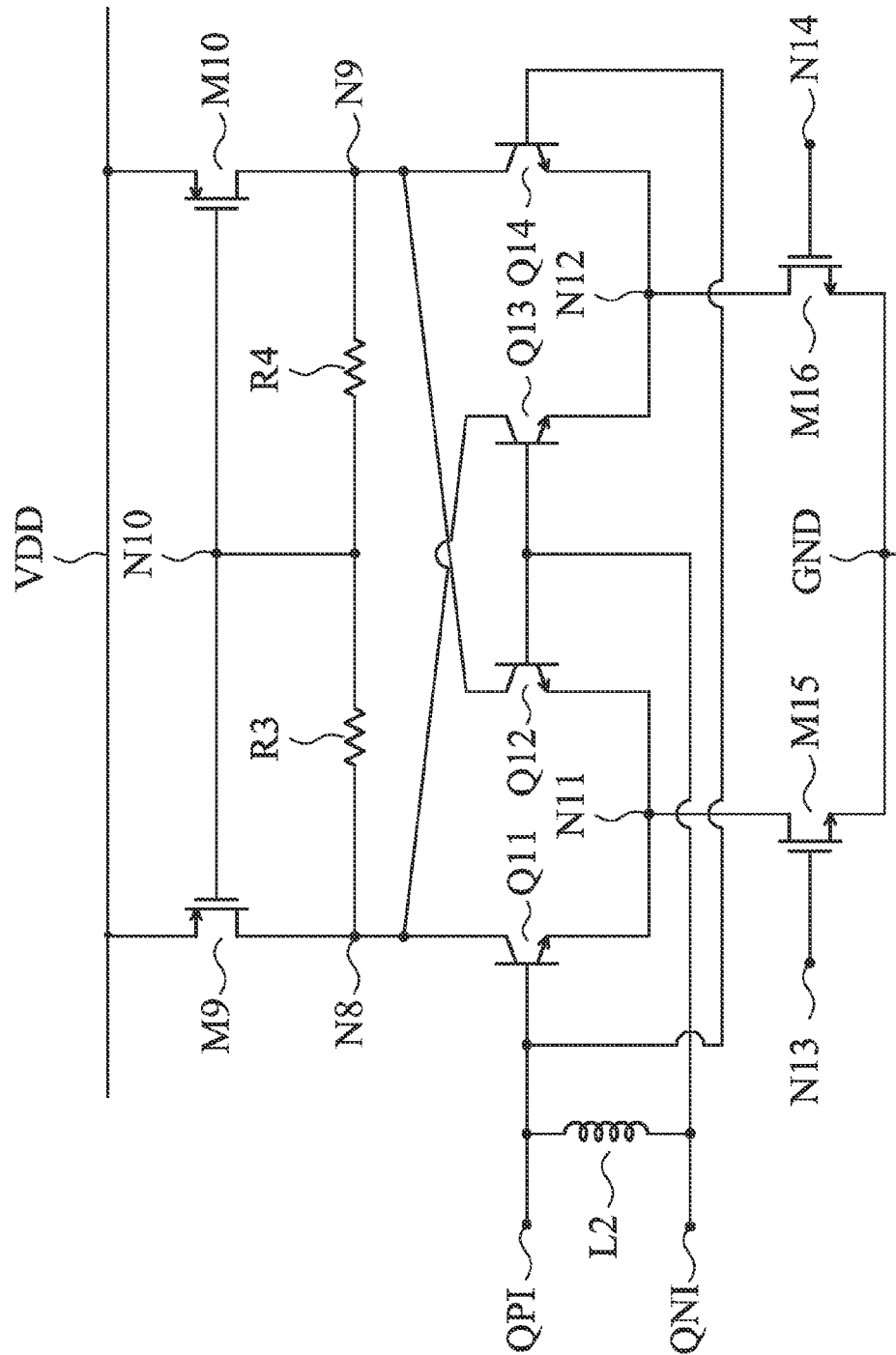
FIG. 3 is a diagram for illustrating another mixer according to an embodiment of the invention.

FIG. 3 is a diagram for illustrating the mixer 110 according to an embodiment of the invention. As shown in FIG. 3, the mixer 110 further comprises transistors M9, M10, Q11, Q12, Q13, Q14, M15 and M16. Each of the transistors M9, M10 may be a PMOS transistor (P-channel Metal-Oxide-Semiconductor Field-Effect Transistor), each of the transistors Q11, Q12, Q13 and Q14 may be an NPN-type BJT (NPN-type bipolar junction transistor), and each of the transistors M15, M16 may be a NMOS transistor (N-channel Metal-Oxide-Semiconductor Field-Effect Transistor). The transistor M9 is electrically coupled between a power node VDD and a node N8, and has a gate coupled to a node N10. The transistor M10 is electrically coupled between the power node VDD and a node N9, and has a gate coupled to the node N10. The transistor Q11 is electrically coupled between the node N8 and a node N11, and has a base coupled to the positive quadrature input QPI. The transistor Q12 is electrically coupled between the node N9 and the node N11, and has a base coupled to the negative quadrature input QNI. The transistor Q13 is electrically coupled between the node N8 and a node N12, and has a base coupled to the negative quadrature input QNI. The transistor Q14 is electrically coupled between the node N9 and the node N12, and has a base coupled to the positive quadrature input QPI. The transistor M15 is electrically coupled between the node N11 and a power node GND, and has a gate coupled to the transformer 104 through a node N13. The transistor M16 is electrically coupled between the node N12 and the power node GND, and has a gate coupled to the transformer 104 through a node N14. A resistor R3 is electrically coupled between the nodes N8, N10, and a resistor R4 is electrically coupled between the nodes N9, N10. The nodes N8, N9 are both electrically coupled to the VGA 114.

Figure 4A:
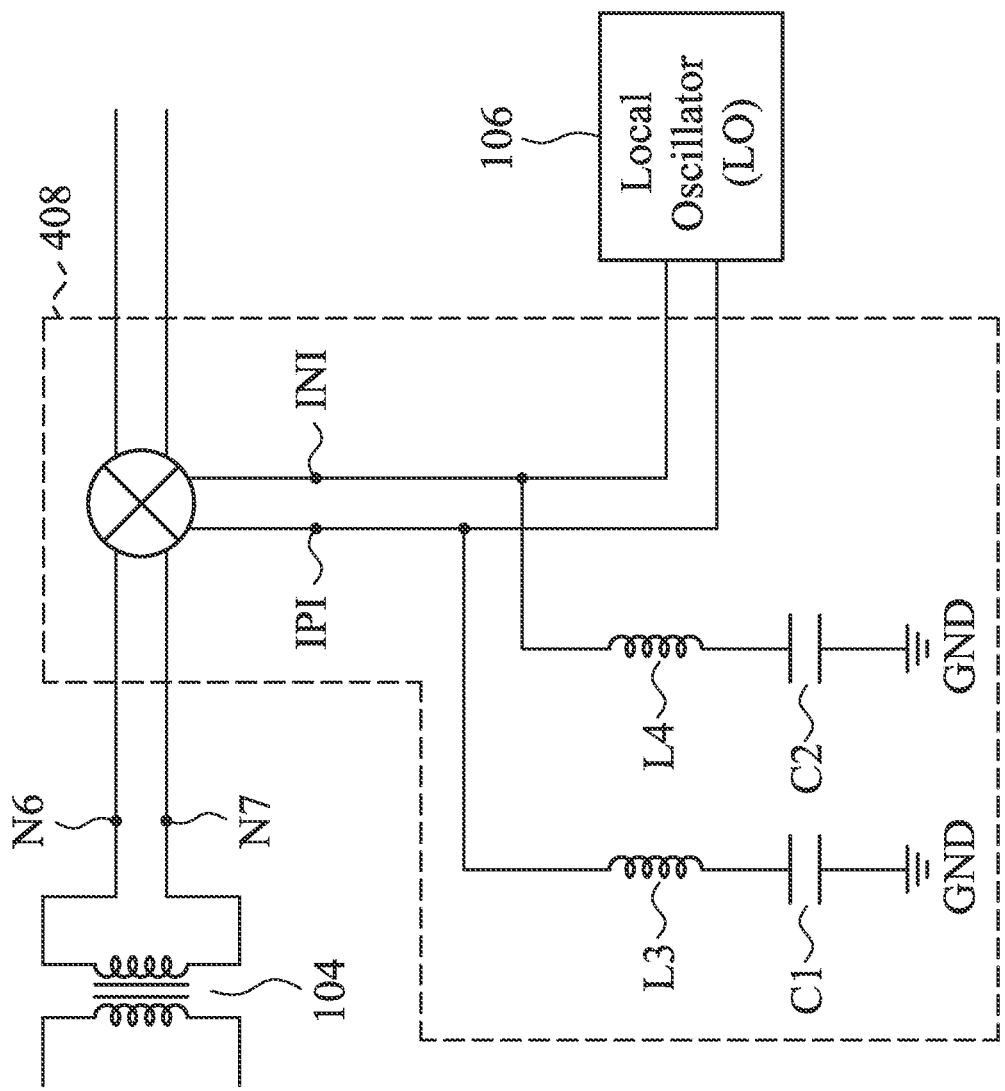
FIG. 4A is a diagram for illustrating a mixer according to another embodiment of the invention.

FIG. 4A is a diagram for illustrating a mixer 408 according to another embodiment of the invention. The mixer 408 in FIG. 4A is similar to the mixer 108 in FIG. 1, but the difference between them is as follows: (1) The inductor L1 is removed; (2) The positive in-phase input IPI is electrically coupled to the power node GND through an inductor L3 and a capacitor C1; and (3) The negative in-phase input INI is electrically coupled to the power node GND through an inductor L4 and a capacitor C2. The capacitors C1, C2 are both configured to block DC (direct current), and the capacitance of each of the capacitors C1, C2 is greater than 10 pF. In FIG. 4A, the inductor L1 is replaced with the inductors L3, L4 coupled to the power node GND, which increases inductance of the load.

Figure 4B:
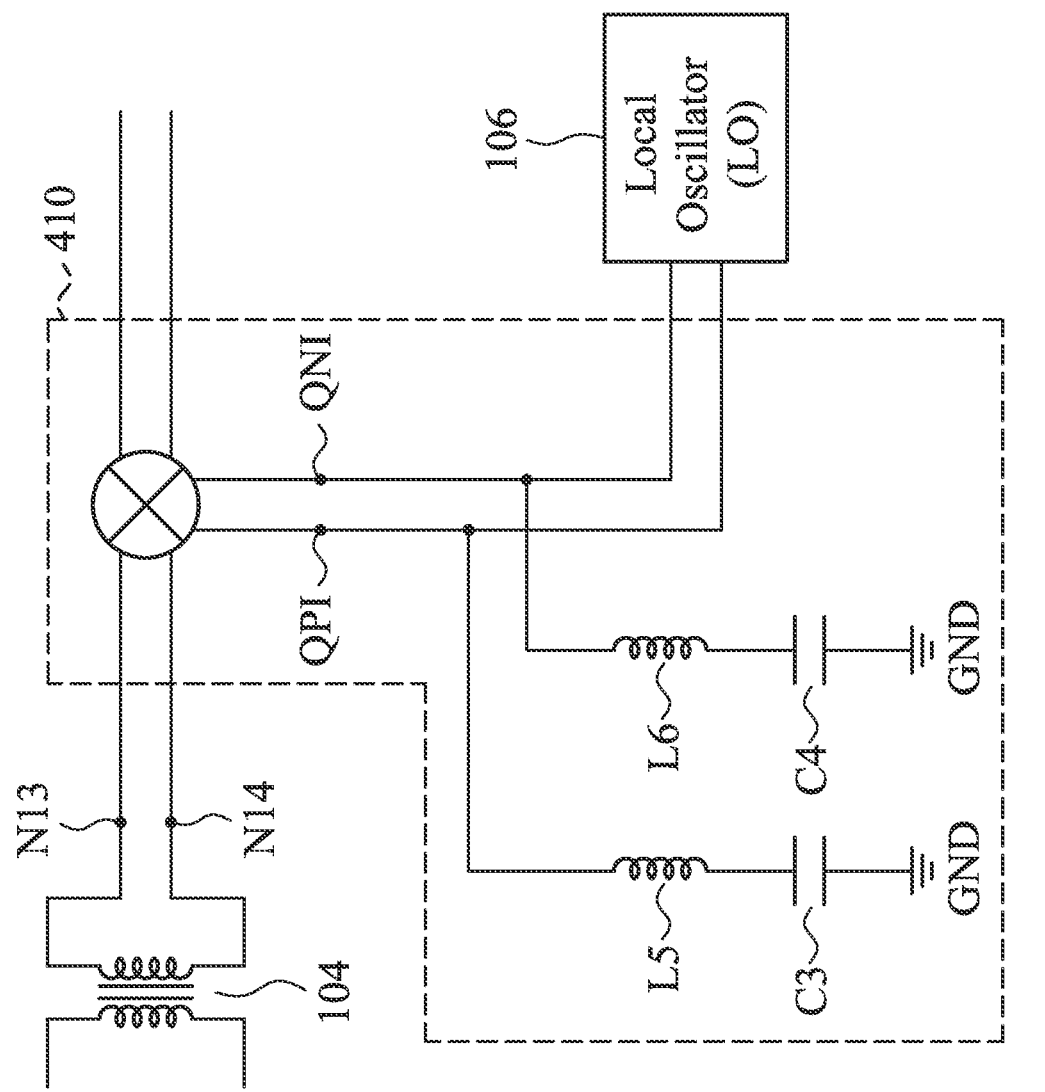
FIG. 4B is a diagram for illustrating another mixer according to another embodiment of the invention.

FIG. 4B is a diagram for illustrating a mixer 410 according to another embodiment of the invention. The mixer 410 in FIG. 4B is similar to the mixer 110 in FIG. 1, but the difference between them is as follows: (1) The inductor L2 is removed; (2) The positive quadrature input QPI is electrically coupled to the power node GND through an inductor L5 and a capacitor C3; and (3) The negative quadrature input QNI is electrically coupled to the power node GND through an inductor L6 and a capacitor C4. The capacitors C3, C4 are both configured to block DC (direct current), and the capacitance of each of the capacitors C3, C4 is greater than 10 pF. In FIG. 4B, the inductor L2 is replaced with the inductors L5, L6 coupled to the power node GND, which increases inductance of the load.

Figure 5A:
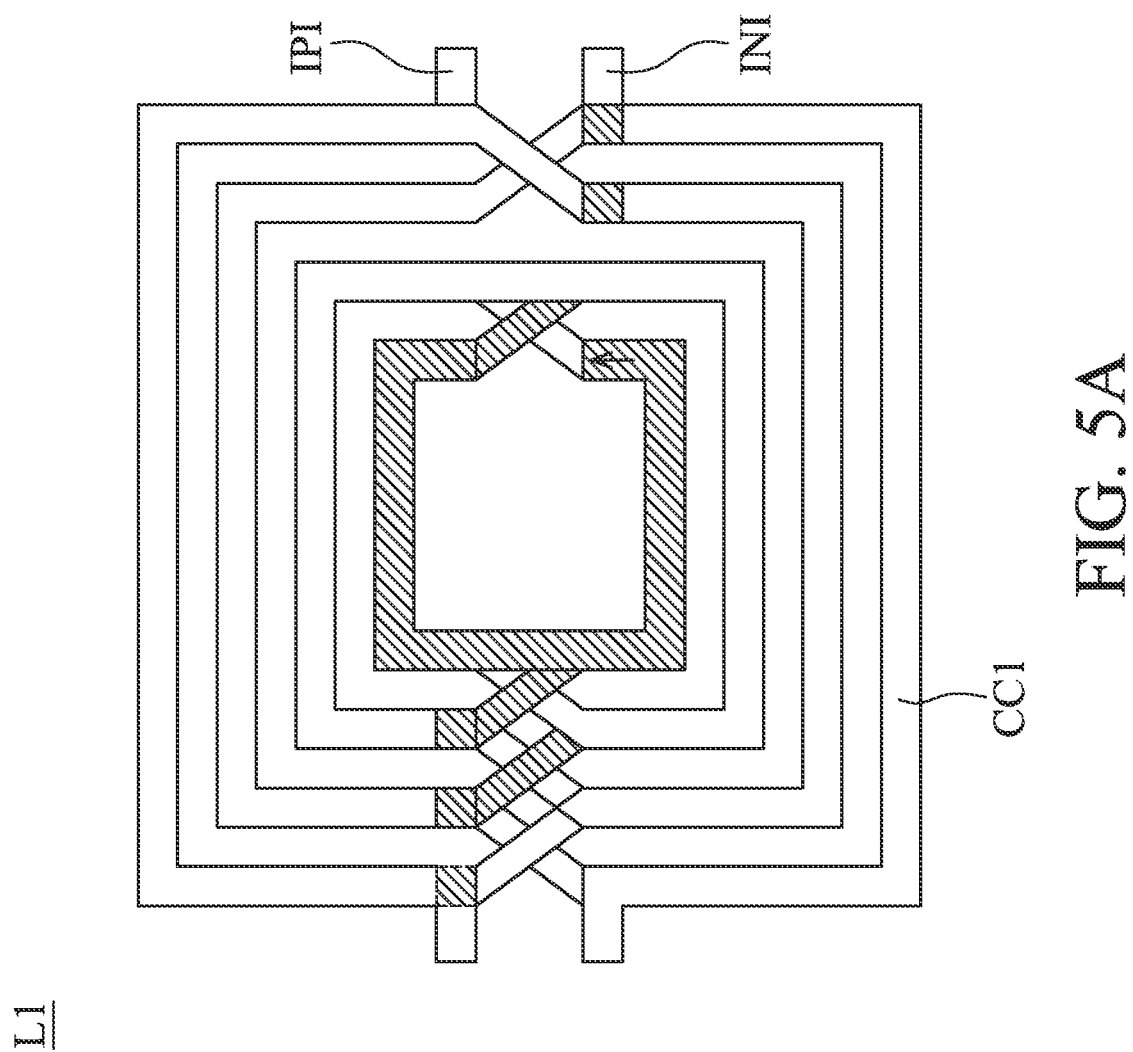
FIG. 5A is a vertical drawing for illustrating an inductor according to an embodiment of the invention.
Figure 5B:
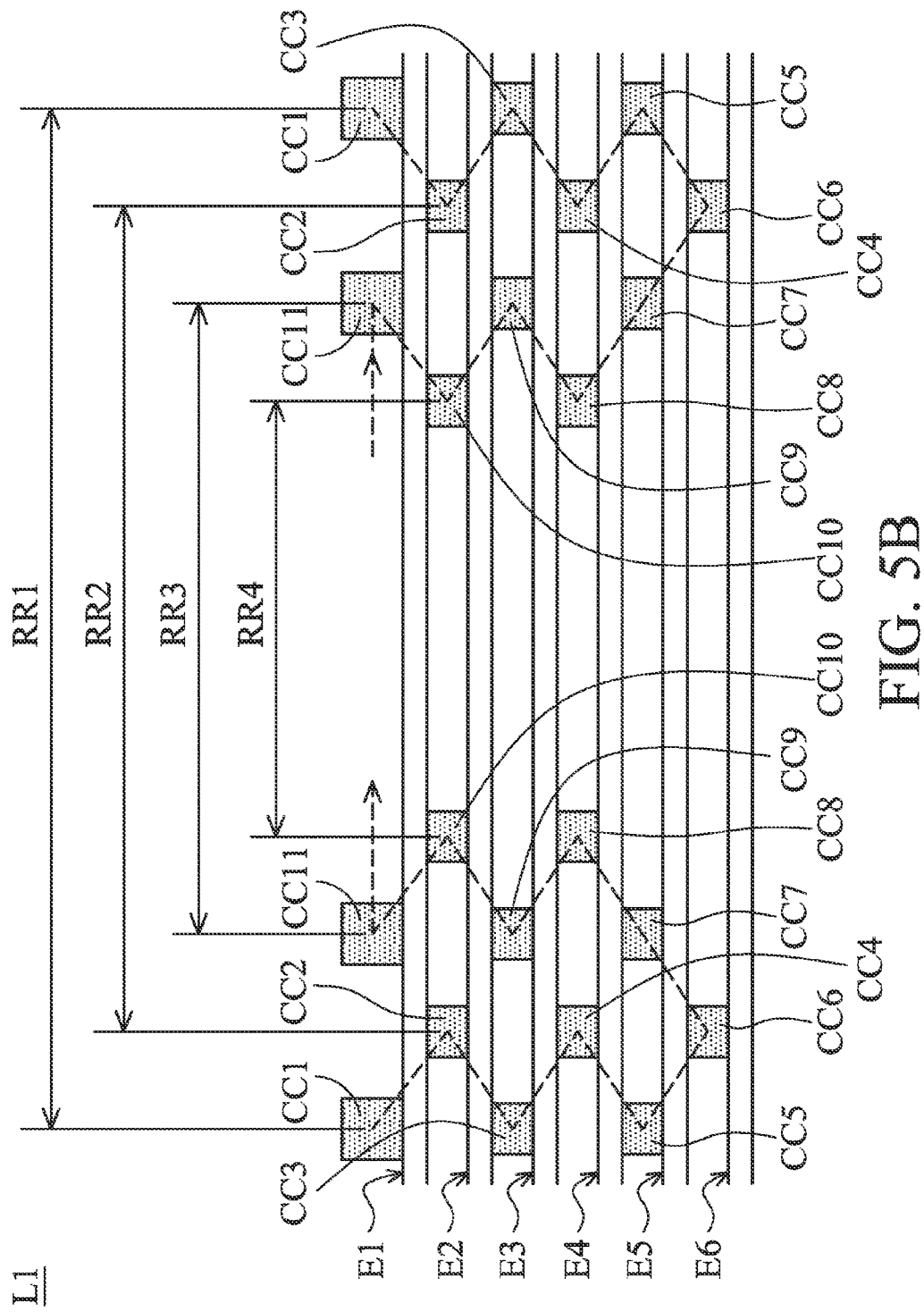
FIG. 5B is a cross-section drawing for illustrating the inductor according to the embodiment of the invention.

FIG. 5A is a vertical drawing for illustrating the inductor L1 according to an embodiment of the invention. FIG. 5B is a cross-section drawing for illustrating the inductor L1 according to the embodiment of the invention. As shown in FIG. 5A, 5B, the inductor L1 comprises coils CC1, CC2, CC3, CC4, CC5, CC6, CC7, CC8, CC9, CC10, and CC11. The coil CC1 is disposed on a plane E1, shaped like a rectangle with a length RR1, and electrically coupled to the positive in-phase input IPI and the negative in-phase input INT. The coil CC2 is disposed on a plane E2, and shaped like a rectangle with a length RR2. The coil CC3 is disposed on a plane E3, and shaped like a rectangle with the same length as the length RR1. The coil CC4 is disposed on a plane E4, and shaped like a rectangle with the same length as the length RR2. The coil CC5 is disposed on a plane E5, and shaped like a rectangle with the same length as the length RR1. The coil CC6 is disposed on a plane E6, and shaped like a rectangle with the same length as the length RR2. The coil CC7 is disposed on the plane E5, and shaped like a rectangle with a length RR3. The coil CC8 is disposed on the plane E4, and shaped like a rectangle a length RR4. The coil CC9 is disposed on the plane E3, and shaped like a rectangle with the same length as the length RR3. The coil CC10 is disposed on the plane E2, and shaped like a rectangle with the same length as the length RR4. The coil CC11 is disposed on the plane E1, and shaped like a rectangle with the same length as the length RR3. The planes E1, E2, E3, E4, E5 and E6 are parallel to each other. The length RR1 is longer than the length RR2. The length RR2 is longer than the length RR3. The length RR3 is longer than the length RR4. A current path is formed through the coils CC1, CC2, CC3, CC4, CC5, CC6, CC7, CC8, CC9, CC10 and CC11. The inductor L1 shown in FIG. 5A, FIG. 5B is formed through 11 coils winding inward. This saves space in a circuit layout. Also, the inductor L1 may be formed by a different number of coils so as to provide different inductance, for example, by 3, 15 or 18 coils.

Figure 6A:
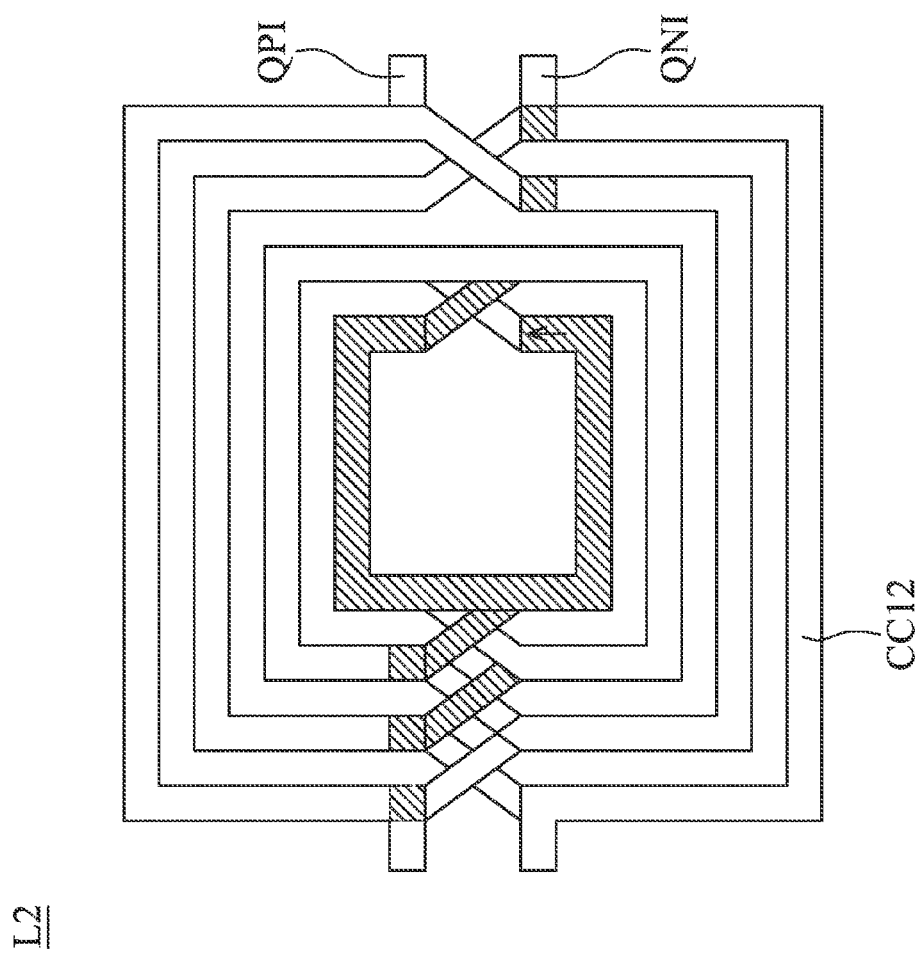
FIG. 6A is a vertical drawing for illustrating another inductor according to an embodiment of the invention.
Figure 6B:
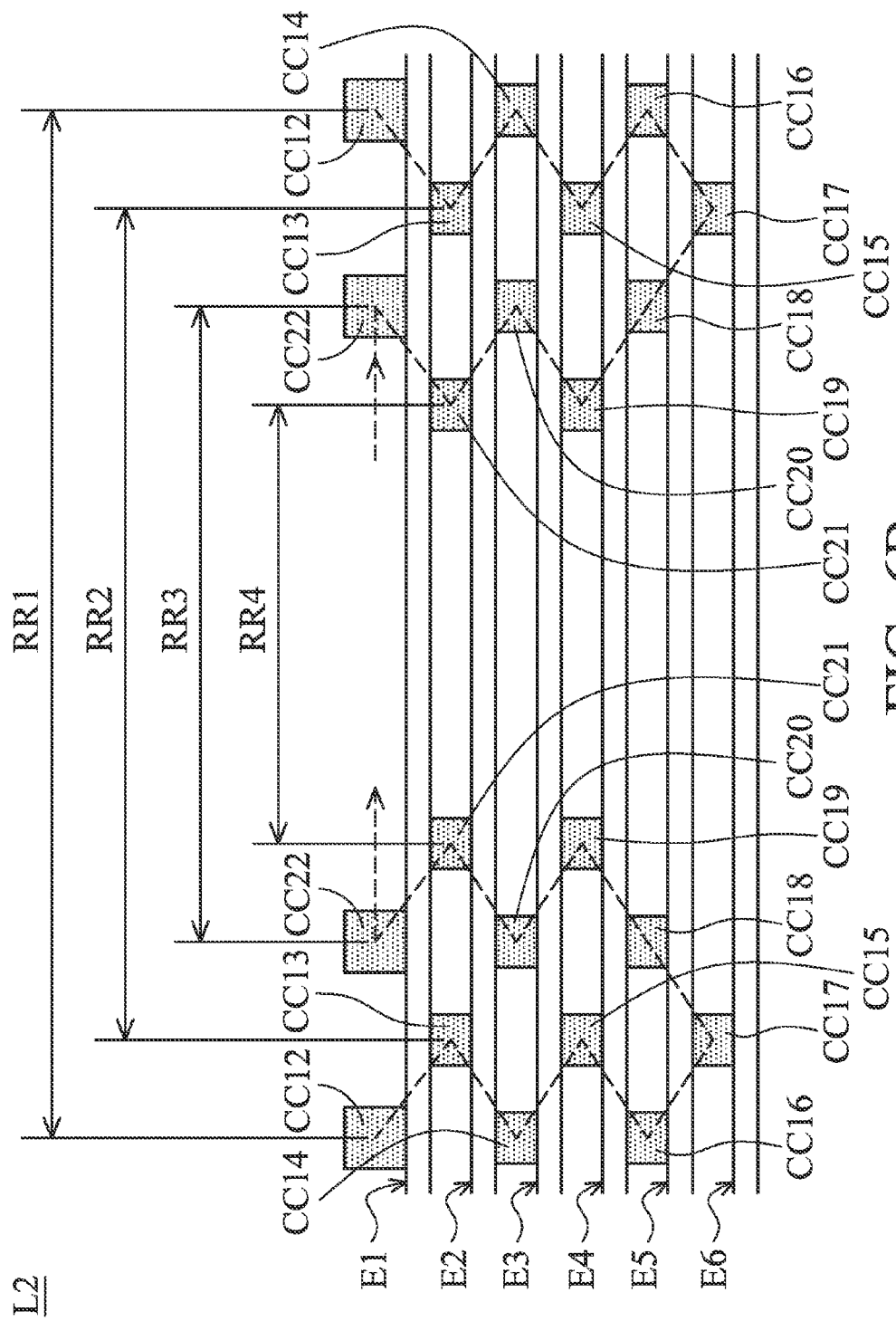
FIG. 6B is a cross-section drawing for illustrating the inductor according to the embodiment of the invention.

FIG. 6A is a vertical drawing for illustrating the inductor L2 according to an embodiment of the invention. FIG. 6B is a cross-section drawing for illustrating the inductor L2 according to the embodiment of the invention. As shown in FIG. 6A, 6B, the inductor L2 comprises coils CC12, CC13, CC14, CC15, CC16, CC17, CC18, CC19, CC20, CC21, and CC22. The coil CC12 is disposed on a plane E1, shaped like a rectangle with a length RR1, and electrically coupled to the positive quadrature input QPI and the negative quadrature input QNI. The coil CC13 is disposed on a plane E2, and shaped like a rectangle with a length RR2. The coil CC14 is disposed on a plane E3, and shaped like a rectangle with the same length as the length RR1. The coil CC15 is disposed on a plane E4, and shaped like a rectangle with the same length as the length RR2. The coil CC16 is disposed on a plane E5, and shaped like a rectangle with the same length as the length RR1. The coil CC17 is disposed on a plane E6, and shaped like a rectangle with the same length as the length RR2. The coil CC18 is disposed on the plane E5, and shaped like a rectangle with a length RR3. The coil CC19 is disposed on the plane E4, and shaped like a rectangle with a length RR4. The coil CC20 is disposed on the plane E3, and shaped like a rectangle with the same length as the length RR3. The coil CC21 is disposed on the plane E2, and shaped like a rectangle with the same length as the length RR4. The coil CC22 is disposed on the plane E1, and shaped like a rectangle with the same length as the length RR3. The planes E1, E2, E3, E4, E5 and E6 are parallel to each other. The length RR1 is longer than the length RR2. The length RR2 is longer than the length RR3. The length RR3 is longer than the length RR4. A current path is formed through the coils CC12, CC13, CC14, CC15, CC16, CC17, CC18, CC19, CC20, CC21, and CC22. The inductor L2 shown in FIG. 6A, FIG. 6B is formed through 11 coils winding inward. This saves space in a circuit layout. Also, the inductor L2 may be formed by a different number of coils so as to provide different inductance, for example, by 3, 15 or 18 coils.

Use of ordinal terms such as "1st", "2nd", "3rd", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An RF (Radio Frequency) circuit, comprising:
   a transformer, receiving an RF signal so as to generate a pair of transformed signals;
   a local oscillator, generating a 1st oscillating signal, a 2nd oscillating signal, a 3rd oscillating signal, and a 4th oscillating signal according to a local oscillating signal;
   a 1st mixer, generating a 1st mixed signal according to the pair of transformed signals and the 1st and 2nd oscillating signals, and comprising:
      a positive in-phase input, receiving the 1st oscillating signal;
      a negative in-phase input, receiving the 2nd oscillating signal; and
      a 1st inductor, coupled between the positive in-phase input and the negative in-phase input;
   a 2nd mixer, generating a 2nd mixed signal according to the pair of transformed signals and the 3rd and 4th oscillating signals, and comprising:
      a positive quadrature input, receiving the 3rd oscillating signal;
      a negative quadrature input, receiving the 4th oscillating signal; and
      a 2nd inductor, coupled between the positive quadrature input and the negative quadrature input;
   a 1st VGA (Variable Gain Amplifier), generating a mid-band in-phase differential signal; and
   a 2nd VGA, generating a mid-band quadrature differential signal.

2. The RF circuit as claimed in claim 1, wherein the 1st mixer further comprises:
   a 1st transistor, coupled between a 2nd power node and a 1st node, and having a 1st gate coupled to a 3rd node;
   a 2nd transistor, coupled between the 2nd power node and a 2nd node, and having a 2nd gate coupled to the 3rd node;
   a 3rd transistor, coupled between the 1st node and a 4th node, and having a 3rd base coupled to the positive in-phase input;
   a 4th transistor, coupled between the 2nd node and the 4th node, and having a 4th base coupled to the negative in-phase input;
   a 5th transistor, coupled between the 1st node and a 5th node, and having a 5th base coupled to the negative in-phase input;
   a 6th transistor, coupled between the 2nd node and the 5th node, and having a 6th base coupled to the positive in-phase input;
   a 7th transistor, coupled between the 4th node and a 1st power node, and having a 7th gate coupled to the transformer; and
   an 8th transistor, coupled between the 5th node and the 1st power node, and having an 8th gate coupled to the transformer,
   wherein the 1st and 2nd nodes are both coupled to the 1st VGA.

3. The RF circuit as claimed in claim 2, wherein the 1st mixer further comprises:
   a 1st resistor, coupled between the 1st node and the 3rd node; and
   a 2nd resistor, coupled between the 2nd node and the 3rd node.

4. The RF circuit as claimed in claim 2, wherein each of the 3rd, 4th, 5th and 6th transistors is a BJT (Bipolar Junction Transistor).

5. The RF circuit as claimed in claim 1, wherein the 2nd mixer further comprises:
   a 9th transistor, coupled between a 2nd power node and an 8th node, and having a 9th gate coupled to a 10th node;
   a 10th transistor, coupled between the 2nd power node and a 9th node, and having a 10th gate coupled to the 10th node;

a 11th transistor, coupled between the 8th node and a 11th node, and having a 11th base coupled to the positive quadrature input;

a 12th transistor, coupled between the 9th node and the 11th node, and having a 12th base coupled to the negative quadrature input;

a 13th transistor, coupled between the 8th node and a 12th node, and having a 13th base coupled to the negative quadrature input;

a 14th transistor, coupled between the 9th node and the 12th node, and having a 14th base coupled to the positive quadrature input;

a 15th transistor, coupled between the 11th node and a 1st power node, and having a 15th gate coupled to the transformer; and a 16th transistor, coupled between the 12th node and the 1st power node, and having a 16th gate coupled to the transformer, wherein the 8th and 9th nodes are both coupled to the 2nd VGA.

6. The RF circuit as claimed in claim 5, wherein the 2nd mixer further comprises:

a 3rd resistor, coupled between the 8th node and the 10th node; and a 4th resistor, coupled between the 9th node and the 10th node.

7. The RF circuit as claimed in claim 5, wherein each of the 11th, 12th, 13th and 14th transistors is a BJT.

8. The RF circuit as claimed in claim 1, wherein the 1st inductor comprises:

a 1st coil, disposed on a 1st plane, shaped like a rectangle with a 1st length, and coupled to the positive in-phase input and to the negative in-phase input;

a 2nd coil, disposed on a 2nd plane, and shaped like a rectangle with a 2nd length;

a 3rd coil, disposed on a 3rd plane, and shaped like a rectangle with the same length as the 1st length;

a 4th coil, disposed on a 4th plane, and shaped like a rectangle with the same length as the 2nd length;

a 5th coil, disposed on a 5th plane, and shaped like a rectangle with the same length as the 1st length;

a 6th coil, disposed on a 6th plane, and shaped like a rectangle with the same length as the 2nd length;

a 7th coil, disposed on the 5th plane, and shaped like a rectangle with a 3rd length, wherein:

a current path is formed through the 1st, 2nd, 3rd, 4th, 5th, 6th and 7th coils;

the 1st, 2nd, 3rd, 4th, 5th and 6th planes are parallel to each other;

the 1st length is longer than the 2nd length; and the 2nd length is longer than the 3rd length.

9. The RF circuit as claimed in claim 8, wherein the 1st inductor further comprises:

an 8th coil, disposed on the 4th plane, and shaped like a rectangle with a 4th length;

a 9th coil, disposed on the 3rd plane, and shaped like a rectangle with the same length as the 3rd length;

a 10th coil, disposed on the 2nd plane, and shaped like a rectangle with the same length as the 4th length;

a 11th coil, disposed on the 1st plane, and shaped like a rectangle with the same length as the 3rd length, wherein:

the current path is formed through the 1st, 2nd, 3rd, 4th, 5th, 6th, 7th, 8th, 9th, 10th and 11th coils; and the 3rd length is longer than the 4th length.

10. The RF circuit as claimed in claim 1, wherein the 2nd inductor comprises:

a 12th coil, disposed on a 1st plane, shaped like a rectangle with a 1st length, and coupled to the positive quadrature input and to the negative quadrature input;

a 13th coil, disposed on a 2nd plane, and shaped like a rectangle with a 2nd length;

a 14th coil, disposed on a 3rd plane, and shaped like a rectangle with the same length as the 1st length;

a 15th coil, disposed on a 4th plane, and shaped like a rectangle with the same length as the 2nd length;

a 16th coil, disposed on a 5th plane, and shaped like a rectangle with the same length as the 1st length;

a 17th coil, disposed on a 6th plane, and shaped like a rectangle with the same length as the 2nd length;

an 18th coil, disposed on the 5th plane, and shaped like a rectangle with a 3rd length, wherein:

a current path is formed through the 12th, 13th, 14th, 15th, 16th, 17th and 18th coils;

the 1st, 2nd, 3rd, 4th, 5th and 6th planes are parallel to each other;

the 1st length is longer than the 2nd length; and the 2nd length is longer than the 3rd length.

11. The RF circuit as claimed in claim 10, wherein the 2nd inductor further comprises:

a 19th coil, disposed on the 4th plane, and shaped like a rectangle with a 4th length;

a 20th coil, disposed on the 3rd plane, and shaped like a rectangle with the same length as the 3rd length;

a 21st coil, disposed on the 2nd plane, and shaped like a rectangle with the same length as the 4th length;

a 22nd coil, disposed on the 1st plane, and shaped like a rectangle with the same length as the 3rd length, wherein:

the current path is formed through the 12th, 13th, 14th, 15th, 16th, 17th, 18th, 19th, 20th, 21st and 22nd coils; and the 3rd length is longer than the 4th length.

12. A mixer for generating a mixed signal according to a pair of transformed signals and 1st and 2nd oscillating signals, comprising:

a positive in-phase input, receiving the 1st oscillating signal;

a negative in-phase input, receiving the 2nd oscillating signal; and an inductor, coupled between the positive in-phase input and the negative in-phase input.

13. The mixer as claimed in claim 12, further comprising:

a 1st transistor, coupled between a 2nd power node and a 1st node, and having a 1st gate coupled to a 3rd node;

a 2nd transistor, coupled between the 2nd power node and a 2nd node, and having a 2nd gate coupled to the 3rd node;

a 3rd transistor, coupled between the 1st node and a 4th node, and having a 3rd base coupled to the positive in-phase input;

a 4th transistor, coupled between the 2nd node and the 4th node, and having a 4th base coupled to the negative in-phase input;

a 5th transistor, coupled between the 1st node and a 5th node, and having a 5th base coupled to the negative in-phase input;

a 6th transistor, coupled between the 2nd node and the 5th node, and having a 6th base coupled to the positive in-phase input;

a 7th transistor, coupled between the 4th node and a 1st power node, and having a 7th gate coupled to the transformer; and an 8th transistor, coupled between the 5th node and the 1st power node, and having an 8th gate coupled to the transformer.

14. The mixer as claimed in claim 13, further comprising:
a 1st resistor, coupled between the 1st node and the 3rd node; and
a 2nd resistor, coupled between the 2nd node and the 3rd node.

15. The mixer as claimed in claim 13, wherein each of the 3rd, 4th, 5th and 6th transistors is a BJT (Bipolar Junction Transistor).

16. The mixer as claimed in claim 12, wherein the inductor comprises:
a 1st coil, disposed on a 1st plane, shaped like a rectangle with a 1st length, and coupled to the positive in-phase input and to the negative in-phase input;
a 2nd coil, disposed on a 2nd plane, and shaped like a rectangle with a 2nd length;
a 3rd coil, disposed on a 3rd plane, and shaped like a rectangle with the same length as the 1st length;
a 4th coil, disposed on a 4th plane, and shaped like a rectangle with the same length as the 2nd length;
a 5th coil, disposed on a 5th plane, and shaped like a rectangle with the same length as the 1st length;
a 6th coil, disposed on a 6th plane, and shaped like a rectangle with the same length as the 2nd length;
a 7th coil, disposed on the 5th plane, and shaped like a rectangle with a 3rd length,
wherein:
a current path is formed through the 1st, 2nd, 3rd, 4th, 5th, 6th and 7th coils;
the 1st, 2nd, 3rd, 4th, 5th and 6th planes are parallel to each other;
the 1st length is longer than the 2nd length; and
the 2nd length is longer than the 3rd length.

17. The mixer as claimed in claim 12, wherein the inductor further comprises:
an 8th coil, disposed on the 4th plane, and shaped like a rectangle with a 4th length;
a 9th coil, disposed on the 3rd plane, and shaped like a rectangle with the same length as the 3rd length;
a 10th coil, disposed on the 2nd plane, and shaped like a rectangle with the same length as the 4th length;
a 11th coil, disposed on the 1st plane, and shaped like a rectangle with the same length as the 3rd length,
wherein:
the current path is formed through the 1st, 2nd, 3rd, 4th, 5th, 6th, 7th, 8th, 9th, 10th and 11th coils; and
the 3rd length is longer than the 4th length.

18. A mixer for generating a mixed signal according to a pair of transformed signals and 1st and 2nd oscillating signals, comprising:
a positive in-phase input, receiving the 1st oscillating signal;
a negative in-phase input, receiving the 2nd oscillating signal;
a 1st inductor, coupled between the positive in-phase input and a 1st power node; and
a 2nd inductor, coupled between the negative in-phase input and the 1st power node.

19. The mixer as claimed in claim 18, further comprising:
a 1st transistor, coupled between a 2nd power node and a 1st node, and having a 1st gate coupled to a 3rd node;
a 2nd transistor, coupled between the 2nd power node and a 2nd node, and having a 2nd gate coupled to the 3rd node;
a 3rd transistor, coupled between the 1st node and a 4th node, and having a 3rd base coupled to the positive in-phase input;
a 4th transistor, coupled between the 2nd node and the 4th node, and having a 4th base coupled to the negative in-phase input;
a 5th transistor, coupled between the 1st node and a 5th node, and having a 5th base coupled to the negative in-phase input;
a 6th transistor, coupled between the 2nd node and the 5th node, and having a 6th base coupled to the positive in-phase input;
a 7th transistor, coupled between the 4th node and the 1st power node, and having a 7th gate coupled to the transformer; and
an 8th transistor, coupled between the 5th node and the 1st power node, and having an 8th gate coupled to the transformer.

20. The mixer as claimed in claim 19, further comprising:
a 1st resistor, coupled between the 1st node and the 3rd node; and
a 2nd resistor, coupled between the 2nd node and the 3rd node.

21. The mixer as claimed in claim 19, wherein each of the 3rd, 4th, 5th and 6th transistors is a BJT.

22. The mixer as claimed in claim 18, further comprising:
a 1st capacitor, coupled between the 1st inductor and the 1st power node; and
a 2nd capacitor, coupled between the 2nd inductor and the 1st power node.

* * * * *